US006810513B1

United States Patent
Vest

(10) Patent No.: US 6,810,513 B1
(45) Date of Patent: Oct. 26, 2004

(54) METHOD AND APPARATUS OF PROGRAMMABLE INTERCONNECT ARRAY WITH CONFIGURABLE MULTIPLEXER

(75) Inventor: William Bradley Vest, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/175,264

(22) Filed: Jun. 19, 2002

(51) Int. Cl.[7] .............................................. G06F 17/50
(52) U.S. Cl. .............................. 716/16; 716/12; 716/13; 716/14
(58) Field of Search .............................. 716/16, 12, 13, 716/14

(56) References Cited

U.S. PATENT DOCUMENTS

| | | | | |
|---|---|---|---|---|
| 4,415,818 A | * | 11/1983 | Ogawa et al. ................ 326/40 |
| 4,677,318 A | * | 6/1987 | Veenstra ....................... 326/40 |
| 5,212,652 A | * | 5/1993 | Agrawal et al. ............... 326/41 |
| 5,323,069 A | * | 6/1994 | Smith, Jr. ..................... 326/47 |
| 5,594,364 A | * | 1/1997 | Chan et al. .................... 326/39 |
| 5,668,771 A | * | 9/1997 | Cliff et al. ............. 365/230.03 |
| 5,689,195 A | | 11/1997 | Cliff et al. ..................... 326/41 |

* cited by examiner

Primary Examiner—Vuthe Siek
Assistant Examiner—Sun James Lin
(74) Attorney, Agent, or Firm—Altera Corporation

(57) ABSTRACT

A method and an apparatus for routing various signals within an integrated circuit is disclosed. In one embodiment, the integrated circuit is a programmable logic device, wherein it includes a logic block, a control block, and a routing block. Each logic block further includes multiple logical array blocks so that logical array blocks can be configured to perform specific logic functions. The routing block includes a first and second routing arrays, wherein each routing array has at least one configurable multiplexer and one output circuit. The configurable multiplexer of the first routing array can be programmed to route a signal through the output circuit of the second routing array.

32 Claims, 8 Drawing Sheets

METHOD AND APPARATUS OF PROGRAMMABLE INTERCONNECT ARRAY WITH CONFIGURABLE MULTIPLEXER

FIELD OF THE INVENTION

The present invention relates to the field of integrated circuit performing digital processing functions. More specifically, the present invention relates to the signal routing in the integrated circuit.

BACKGROUND

Circuit designers today typically have a variety of approaches to implement their desirable logical functions. An approach involves incorporating their designs in dedicated custom integrated circuits, also known as custom designs. Another approach involves the implementation of application-specific integrated circuits ("ASICs"). For these approaches, the initial costs are typically high and the turn-around time for producing a first set of these semiconductor chips are relatively long. An alterative approach, which enjoys growing popularity, is utilizing programmable circuit devices, such as programmable logic devices ("PLDs"), or field programmable gate arrays ("FPGAs"), hereinafter referred to as PLD. The circuit designers can program a PLD or PLDs to perform their desirable logical functions.

A PLD is a semiconductor chip that typically includes an array of programmable logic array blocks ("LABs"), routing resources, and input/output ("I/O") pins. Each LAB may further include multiple programmable logic elements ("LEs"). For example, a LAB consists of 16 LEs, wherein each LE can be specifically programmed to perform a function or a set of functions.

A typical routing resource in a PLD is organized in a multiple banks of routing circuits, such as routing multiplexers or selectors. Each bank typically contains a finite number of multiplexers for routing various signals between I/O pins and feedbacks. For example, a routing resource contains four banks and each bank contains nine multiplexers. Accordingly, a bank of routing circuits can route at most nine signals simultaneously. A problem may arise when a bank tries to route more signals than its routing multiplexers. As the previous example illustrated, the routing would fail if the bank with nine multiplexers tries to route ten signals at a given time. The routing failure typically leads to device configuration failure.

Thus, what is needed is a mechanism to enhance the routing resources for PLD.

SUMMARY OF THE INVENTION

A technique for signal routing in an integrated circuit ("IC") is disclosed. In one embodiment, the IC is a programmable logic device ("PLD"), wherein the PLD includes a logic block, a control block, and a routing block. The logic block further includes multiple logical array blocks ("LABs"). Each LAB is organized to contain various programmable logic elements, which can be individually configured to perform one or more specific logic functions. The routing block further includes a programmable interconnection array ("PIA"), which can be configured to transmit various signals between LABs and input/output pins. In one embodiment, PIA includes a first bank or routing array ("RA"), which has at least one configurable multiplexer and one output circuit and a second bank or RA, which also has one configurable multiplexer and one output circuit. The configurable multiplexer of the first bank can be programmed to route a signal to the logic block via the output circuit of the second bank. The configurable multiplexer is programmable to route its output signal through its neighboring bank.

Additional features and benefits of the present invention will become apparent from the detailed description, figures and claims set forth below.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

In the following description, for purposes of explanation, numerous specific details are set forth to provide a thorough understanding of the present invention. It will be apparent, however, to one skilled in the art that these specific details may not be required to practice the present invention. In other instances, well-known circuits and devices are shown in block diagram form to avoid obscuring the present invention.

It is understood that the present invention may contain transistor circuits that are readily manufacturable using well-known CMOS ("complementary metal-oxide semiconductor) technology, or other semiconductor manufacturing processes. In addition, the present invention may be implemented with other manufacturing processes for making digital devices.

While the following discussion of the present invention is presented with respect to implementation in an integrated circuit ("IC"), the present invention is not limited to that implementation. Additionally, the interconnection between circuit elements or blocks may be shown as buses or as single signal lines. Each of the buses may alternatively be a single signal line, and each of the single signal lines may alternatively be buses.

A technique for providing a flexible routing structure in an IC is described. In one embodiment, the integrated circuit is a programmable logic device ("PLD"), wherein the PLD includes a logic block, a control block, and a routing block. Each logic block further includes multiple logical array blocks ("LABs'). Each LAB is organized to contain various programmable logic elements ("LEs") that can be individually configured to perform various specific logic functions. The routing block is structured to include at least one programmable interconnection array ("PIA").

PIA can be configured to transmit various signals, which can be data and/or control signals, between LABs and input/output pins. In one embodiment, PIA includes a first and second banks, also known as routing arrays ("RAs"), wherein each bank has at least one configurable multiplexer and one output circuit. The configurable multiplexer of the first bank can be programmed to route a signal to the logic block via the output circuit of the second bank. The configurable multiplexer is programmable to route its output signal through its neighboring bank.

Figure 1:
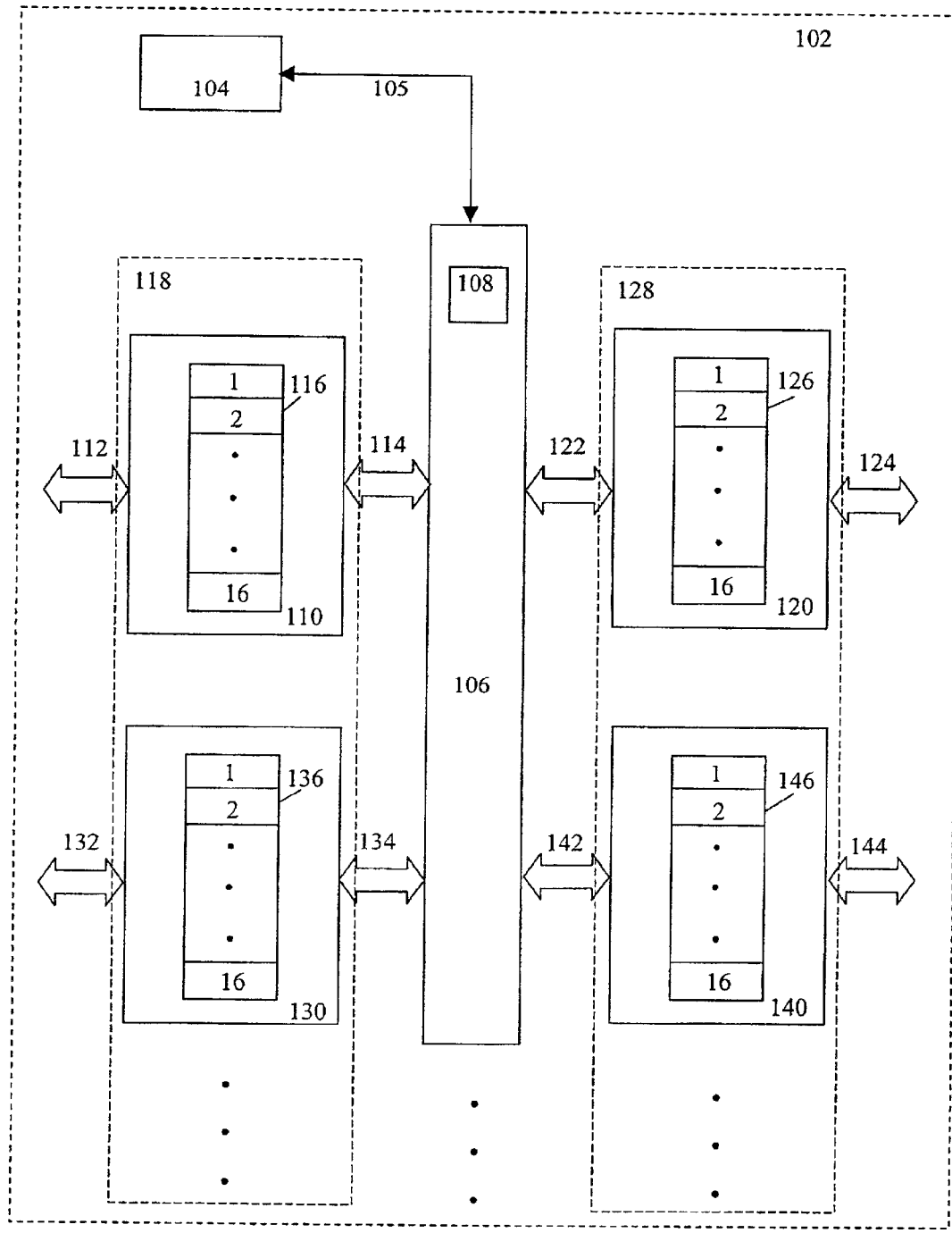
FIG. 1 is a block diagram illustrating a device containing logical array blocks and programmable interconnection arrays in accordance with an embodiment of the present invention.

FIG. 1 is a block diagram of an IC 102 in accordance with an embodiment of the present invention. Referring to FIG. 1, IC 102 includes logic blocks 118, 128, an I/O control unit 104, and a PIA 106. Logic blocks 118, 128 further include multiple LABs 110, 120, 130, 140, wherein each LAB is organized to contain, among other circuits, a set of programmable LEs, also known as macrocell. In one embodiment, the LAB has a set of sixteen programmable LEs. I/O pins (not shown in FIG. 1), LABs, and LEs are linked by PIA 106 and various buses, such as buses 114, 122, 134, 142 are used to link between PIA 106 and LABs while buses 112, 132, 124, 144 are used to connect various I/O pins. Each LE includes programmable circuits such as the product-term matrix, and a register(s). In this embodiment, each LE can be independently configured to perform sequential and/or combinatorial logic operation(s). It should be noted that the underlying concept of the present invention would not change if one or more LABs and/or LEs were added to IC 102.

In one embodiment, I/O control unit 104, which is coupled to PIA 106 via a bus 105, allows various I/O pins to be individually configured. Some I/O pins can be programmed as input pins while other I/O pins are configured as output pins. Some I/O pins can be further programmed as bi-directional I/O pins that are capable of receiving and sending signals at the same time. In another embodiment, I/O control unit 104 also provides clock signals for the PLD chip. It should be noted that some I/O pins may be controlled by non-controlling circuitry on the chip.

Referring to FIG. 1, PIA 106 is coupled to logic blocks 118, 128 and I/O control unit 104 via various buses such as buses 114, 122, 134, 142, 105. Each bus may include a channel (or wire) or a set of channels. It should be noted that the terms channel, routing channel, wire, bus, connection, and interconnection will be used interchangeably herein. PIA 106 receives and transmits various signals directly or indirectly to I/O pins and LABs.

In one embodiment, PIA 106 is arranged based on multiple multiplexers, also known as a multiplexing structure or multiplexing connections. The multiplexers in PIA 106 are organized into multiple banks (or columns) of multiplexing devices, also known as muxes or selectors. To improve the routability, PIA 106 is structured to include configurable multiplexers 108 and configurable output circuits or buffers. The configurable multiplexer 108 is a programmable device that can be divided into multiple sections, wherein a section of the configurable multiplexer may be borrowed by another configurable multiplexer resided in an adjacent bank.

Figure 2:
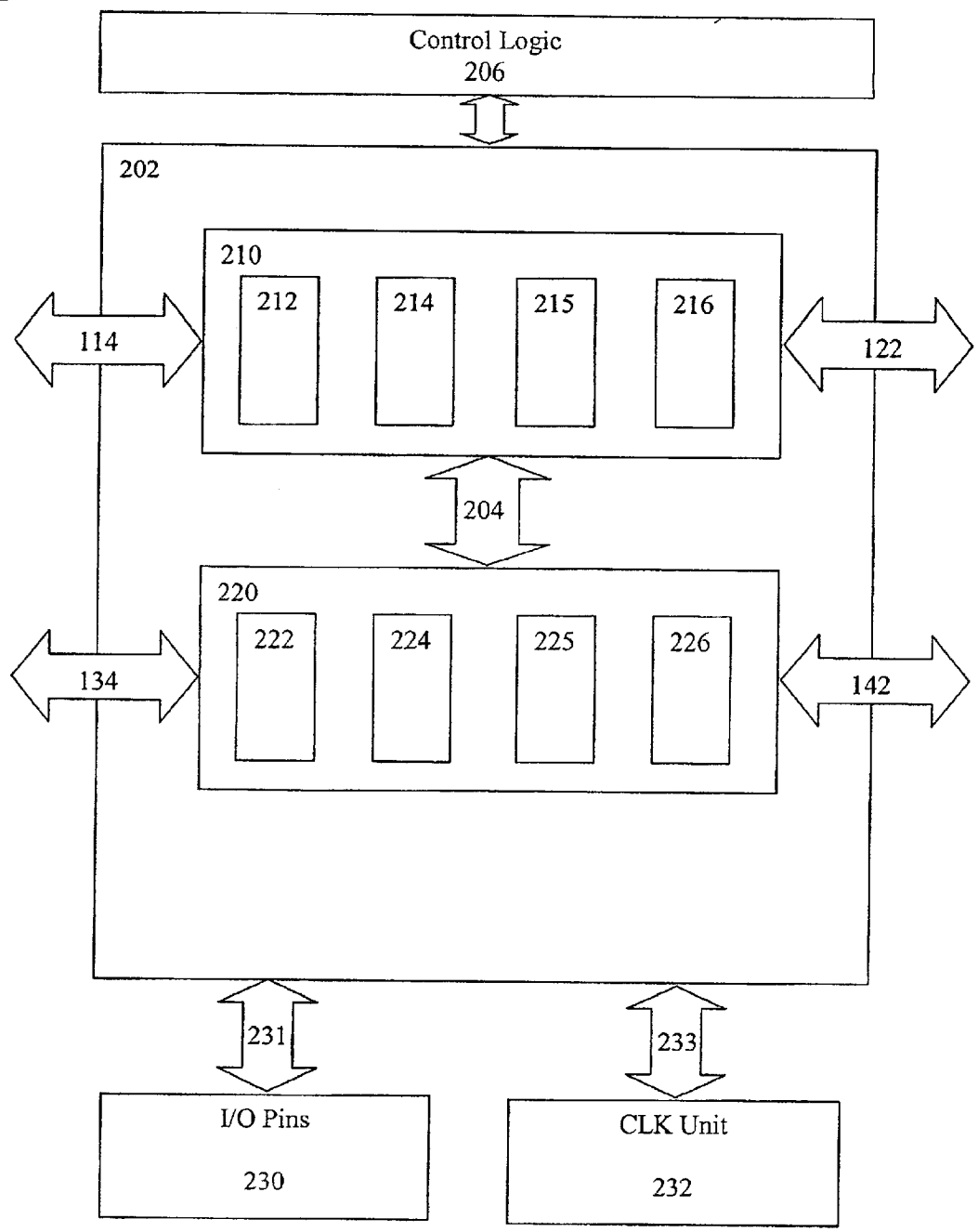
FIG. 2 is a routing block diagram illustrating various routing groups in accordance with an embodiment of the present invention.

FIG. 2 illustrates an embodiment of routing block 200, which includes a control logic 206, a PIA 202, an I/O block 230, and a clock unit 232. In one embodiment, the control logic 206, as I/O control unit 104 illustrated in FIG. 1, provides various control functions including channel assignment, differential I/O standards, and clock management. The control logic 206 includes non-volatile memory devices such as electrically erasable programmable read-only memory ("EEPROM"), erasable programmable read-only memory ("EPROM"), fuses, anti-fuses, magnetic RAM ("MRAM"), and/or flash memory, to store control information. In an alternative embodiment, the control logic 206 includes volatile memory cells such as static random access memory ("SRAM"), dynamic random access memory ("DRAM"), and read-only memory ("ROM"), to store the control information. In yet another embodiment, the control logic 206 is incorporated into PIA 202.

I/O block 230 is connected to PIA 202 via a bus 231. In one embodiment, I/O block 230 includes multiple programmable I/O pins that can receive and transmit signals to the outside of the IC. Each programmable I/O pin can be configured to function as an input, output, and/or bi-directional pin. I/O pin block 230, in one embodiment, is incorporated into the control logic 206.

Clock unit 232 is connected to PIA 202 via a bus 233. Clock unit 232, in one embodiment, receives various clock signals from other components, such as a clock tree circuit or a global clock oscillator. Clock unit 232, in another embodiment, generates clock signals in response to system clocks. Clock unit 232 may receive or generate reference clocks for implementing differential I/O standards. Clock unit 232 may also supply clock signals to PIA 202 including reference clock(s).

Referring to FIG. 2, PLA 202 is organized in an array scheme including multiple channel groups. In this embodiment, PIA 202 includes channel groups 210, 220, bus 204, and I/O buses 114, 122, 134, 142. Channel groups 210, 220 can communicate between each other via bus 204. While channel group 210 uses I/O buses 114 and 122 to communicate with other IC components such as LABs, channel group 220 uses I/O buses 134 and 142 to communicate with other IC components. In one embodiment, PIA 202 also includes control logic 206, I/O pin block 230, and clock unit 232.

Channel groups 210, 220 further include multiplexing banks 212–216, 222–226, respectively. In one embodiment, number of banks within each channel group is a function of the number of LEs within a LAB. For example, more LEs per each LAB may require more multiplexing banks for signal routing. Each multiplexing bank can be configured in a most efficient way for routing. To enhance the routability, at least one bank within the channel group contains a configurable multiplexer, which allows a portion of its multiplexer to be used or shared by another multiplexer, which may be resided in an adjacent bank.

Figure 3:
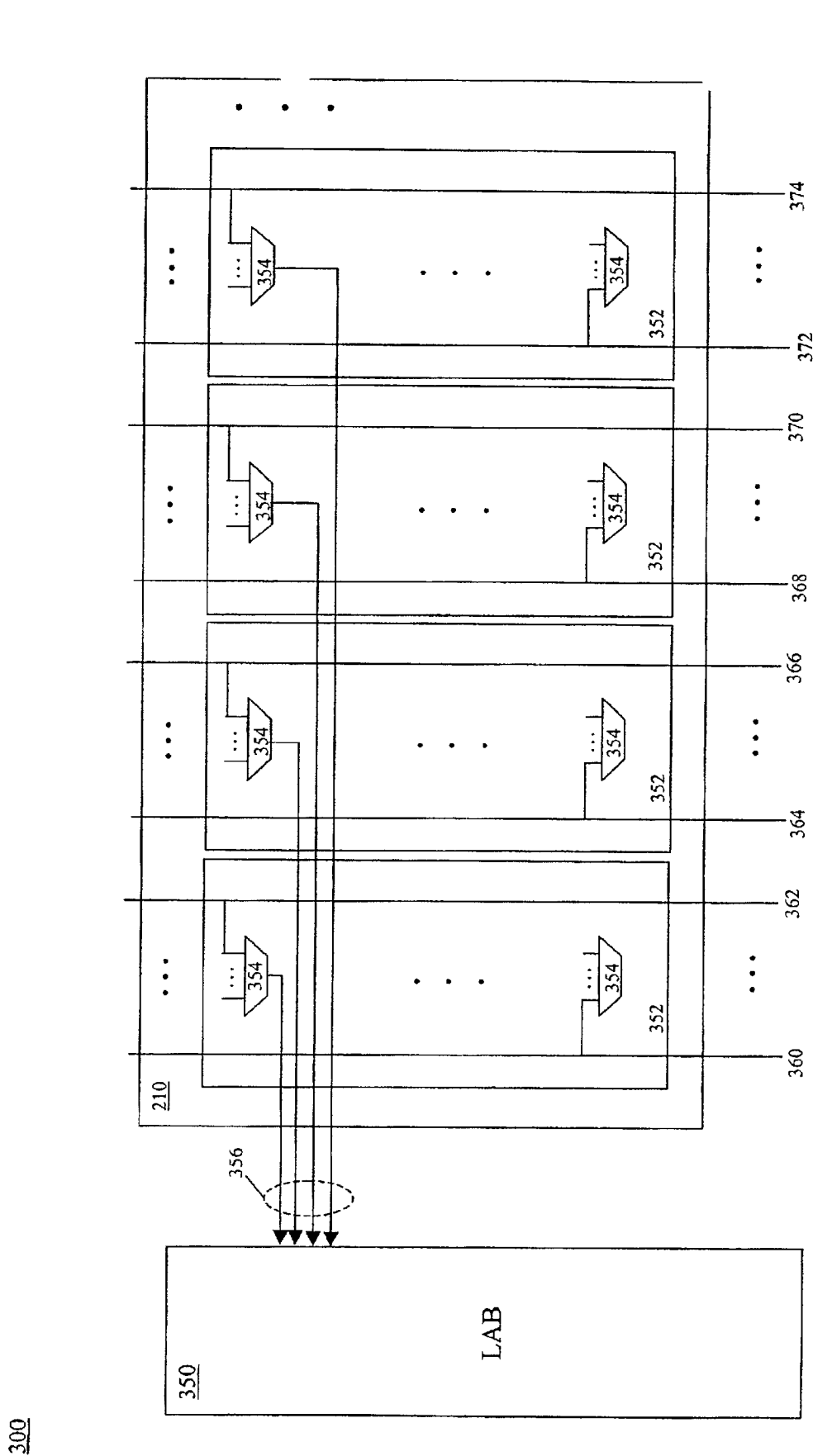
FIG. 3 is a block diagram illustrating routing resources according to an embodiment of the present invention.

FIG. 3 is a block diagram 300 illustrating a high level layout of the channel group 210, which is also shown in FIG. 2, in accordance with an embodiment of present invention. The block diagram 300 includes a channel group 210 and a LAB 350. LAB 350 further contains various circuit components, such as local buses and LEs, for performing logic functions. LAB 350 is coupled with the channel group 210 via a group of output wires 356. The channel group 210 includes multiple multiplexers 354 for routing signals, wherein the multiplexers 354 are organized into four multiplexing banks 352. It should be apparent to one skilled in the art that the underlying concept of the present invention can apply to a channel group that contains more or less than four multiplexing banks 352.

Each bank 352 consists of a finite number of multiplexers or selectors, such as 9, 18, et cetera. In one embodiment, the multiplexers 354 within each bank 352 are organized in a column structure. Banks 352 are arranged side-by-side with each other as shown in FIG. 3. In this embodiment, each bank 352 includes at least one configurable multiplexer. The configurable multiplexer is programmable to transmit more than one signal to its destination device or devices, such as LABs. In another embodiment, all multiplexers 354 within each bank 352 are configurable multiplexers.

Banks 352 are further interconnected to a group of input wires or channels 360–374 and connected to the group of output wires 356. The group of output wires 356 may be directly or indirectly connected to LABs 350, I/O pins, and feedback paths. In one embodiment, the groups of output wires 360–374 are placed on a metal layer of IC that is situated above or below the layer that contains multiplexers 354.

Referring back to FIG. 3, the groups of input wires 360–374 are divided into multiple portions in which each bank connects to a portion of the input wires 360–374. For example, portions of the input wires, such as the input wires 360–362, 364–366, 368–370, and 372–374 are connected to different banks 352. In one embodiment, the number of physical wires of each portion such as 360–362 is more than the number of multiplexers of each bank. For example, a bank 352 is coupled to a portion 360–362 containing 36 wires capable of transmitting 36 signals simultaneously, while the bank 352 only has 9 multiplexers for routing. Accordingly, configurable multiplexers enables a bank 352 to route more signals than its physical number of multiplexers by, in one embodiment, borrowing a portion of multiplexer from its neighboring bank.

Figure 4:
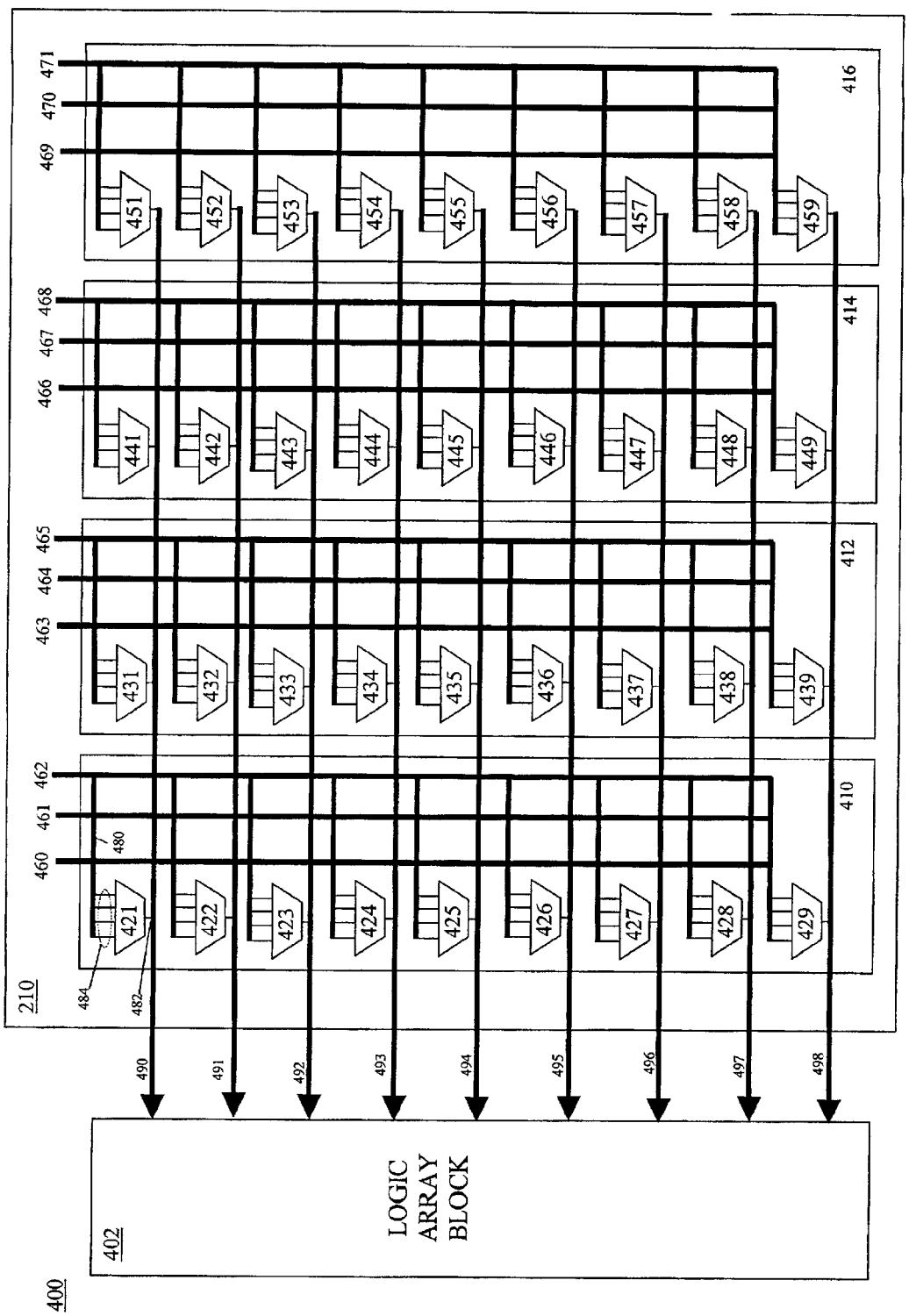
FIG. 4 illustrates a routing resource block diagram having various multiplexers and channels according to one embodiment of the present invention.

FIG. 4 is a logic diagram 400 illustrating a detailed layout of channel group 210 shown in FIG. 2 in accordance with one embodiment of the present invention. The logic diagram 400 includes a channel group 210, LAB 402, input buses 460–471, and output buses. In one embodiment, LAB 402 includes various programmable logic circuits such as look-up table ("LUT") programmable devices and/or product-term ("P-term") programmable devices, for performing specific logic functions. LUT programmable device emulates a logical function that generates outputs based on inputs and a set of stored data. P-term programmable logic performs a function of two or more factors in a Boolean expression combined with a logic AND operator.

The channel group 210, in this embodiment, is arranged in four multiplexing banks 410–416 wherein each multiplexing bank contains nine 4-to-1 configurable multiplexers arranged in a column structure. In one embodiment, each configurable multiplexer can be programmed to perform either a 4-to-1 or two 2-to-1 multiplexing functions. 4-to-1 multiplexing function refers to an implementation of selecting one of four input signals as its output signal in response to its control signals. Similarly, 2-to-1 multiplexing function selects one of two input signals as its output signals. It should be apparent to one skilled in the art that a configurable multiplexer can be programmed to perform different combination of logic functions. For example, two 4-to-1 configurable multiplexers can be programmed to perform a 6-to-1 and a 2-to-1 multiplexing functions. In another example, a 6-to-1 configurable multiplexer can be programmed to perform three 2-to-1 multiplexing functions. Each multiplexer is connected to input buses to receive input signals and connected to output buses to transmit output signals.

Referring to FIG. 4, input buses 460–471 are divided into four groups of inputs wherein each group of inputs is responsible to feed input signals to an associated bank. For example, bank 410 is associated to group of inputs 460–462, wherein the group of inputs 460–462 further includes at least 36 wires and is responsible to feed 36 input signals to the bank 410. In one embodiment, each group of inputs is further divided into three channels, wherein each channel is responsible to transmit signals from a particular source. For example, channel 460 may be assigned to transmit signals from I/O pins, while channel 461 may be assigned to transmit feedback signals from LABs. Also, channel 462 may be assigned to transmit input signals from input ports. Each of these channels 460, 461, 462 may consist of multiple transmission wires and they, in one embodiment, are programmable to connect various configurable multiplexers 421–429. For example, input terminals 484 of configurable multiplexer 421 receives four input signals from the channels 460–462 via a local connection 480, which includes multiple transmission wires.

Output buses illustrated in FIG. 4 include nine output channels 490–498 to route output signals from the banks 410–416 to LAB 402. Every output channel, which may contain multiple transmission wires, is responsible to simultaneously transmit output signals from configurable multiplexers resided on the same row of the banks. For example, configurable multiplexers 421, 431, 441, 451 are resided on the same row of the banks 410–416 and the output channel 490 can transmit the output signals from multiplexers 421, 431, 441, 451 to LAB 402, simultaneously. It should be noted that the output bus may be resided on a metal layer different from the layer in which the configurable multiplexers reside.

In operation, four input terminals 484 of configurable multiplexer 421 receive four input signals from the input channels 460–462 via the local connection 480. If the configurable multiplexer 421 is programmed to perform a 4-to-1 multiplexing function, the configurable multiplexer 421 selects one of the four inputs as its output signal in response to multiplexer control signals. The selected output is subsequently passed to an output buffer, which is not shown in FIG. 4, wherein the output buffer, in one embodiment, is physically coupled with the output channel 490. If the configurable multiplexer 421 is programmed to perform two 2-to-1 multiplexing functions, the configurable multiplexer 421 selects two of the four inputs as its output signals wherein the first output signal is passed onto an output buffer that is associated with the configurable multiplexer 421 while the second output signal, in one embodiment, is passed onto an output buffer that is associated with the configurable multiplexer 431 of the adjacent bank 412. Once the output channel 490 receives the output signals, they are forwarded to LAB 402.

Figure 5:
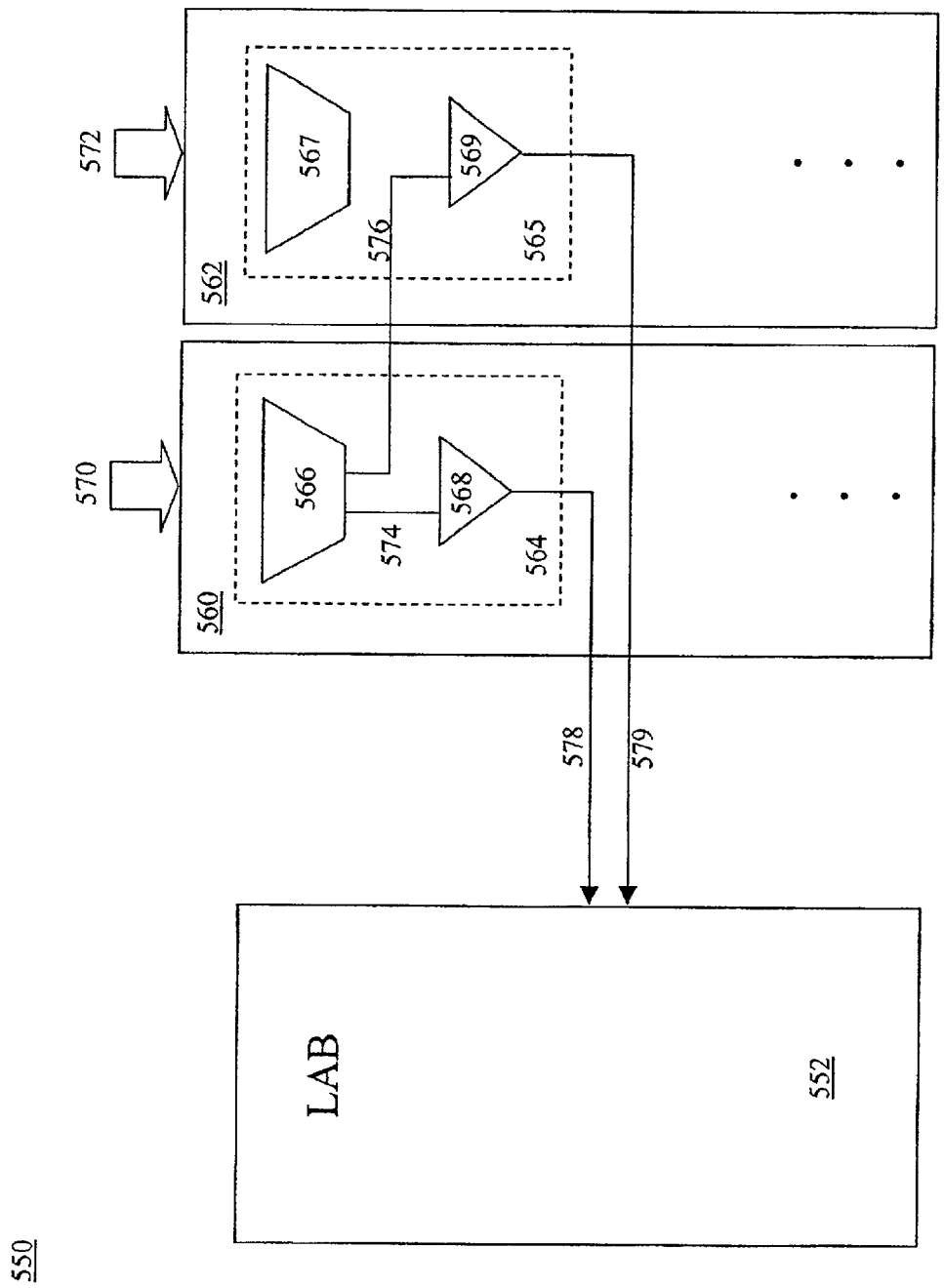
FIG. 5 illustrates a routing device layout including multiplexers and buffers in accordance with an embodiment of the present invention.

FIG. 5 is a block diagram 550 illustrating configurable multiplexers and configurable buffers in accordance with an embodiment of the present invention. The block diagram 550 includes a LAB 552, two multiplexing banks 560–562, and input buses 570–572. The input buses 570–572 perform similar functions as input channels 460–465 described and shown in FIG. 4.

Referring to FIG. 5, two multiplexing banks 560–562 are placed side-by-side or adjacent to each other. It should be apparent to one skilled in the art that if more than two multiplexing banks are involved in the design, they can be all placed adjacent to each other. Bank 560 contains a configurable device 564, which includes a configurable multiplexer 566 and a configurable buffer 568. Bank 562 also contains a configurable device 565 and the configurable device 565 further contains a configurable multiplexer 567 and a configurable buffer 569. It should be noted that the underlying concept of the present invention would not change if one or more configurable devices 564–565 were added to the multiplexing banks 560–562.

Configurable buffers 568–569 perform a relay or re-power function that reenergizes a signal to its full power or voltage level. Configurable buffers 568–569 are, in one embodiment, capable of providing different voltage levels in response to various I/O standards. In another embodiment, each configurable device may contain more than one buffer. It should be apparent to one skilled in the art that configurable buffer could be incorporated in the configurable multiplexer. For example, the configurable buffer 568 is incorporated into the configurable multiplexer 566.

In one embodiment, the configurable multiplexers 566–567 and configurable buffers 568–569 are programmed or controlled through memory bits, also known as Ram-bits. The Ram-bit could be an EEPROM, EPROM, fuses, antifuses, MRAM, and/or flash memory cell. In an alternative embodiment, the Ram-bit could be a volatile memory cell(s) such as SRAM, DRAM, and ROM, to store the control information. In another embodiment, the configurable multiplexers 566–567 and configurable buffers 568–569 are controlled by control signals.

In operation, the input bus 570 passes various input signals to multiplexing bank 560. The input signals may be generated from I/O pins, LABs, and/or input pins. The multiplexing bank 560 subsequently passes a portion of the input signals from the input bus 570 to the input terminals of the configurable multiplexer 566. For this example, the configurable multiplexer 566 is a four-input terminal configurable multiplexer and it is programmed to perform two 2-to-1 multiplexing functions. The configurable multiplexer 566 selects two out of four input signals as its first and second output signals. The first output signal of the configurable multiplexer 566 is fed to the input terminal of configurable buffer 568 and the second output signal of configurable multiplexer 566 is fed to the input terminal of configurable buffer 569, which is resided at the adjacent multiplexing bank 562. Once both signals are buffered at the configurable buffers 568–569, they are transmitted to LAB 552 via transmission wires 578, 579. The transmission wires 578 and 579 perform similar functions as output channel 490 described and shown in FIG. 4.

Figure 6:
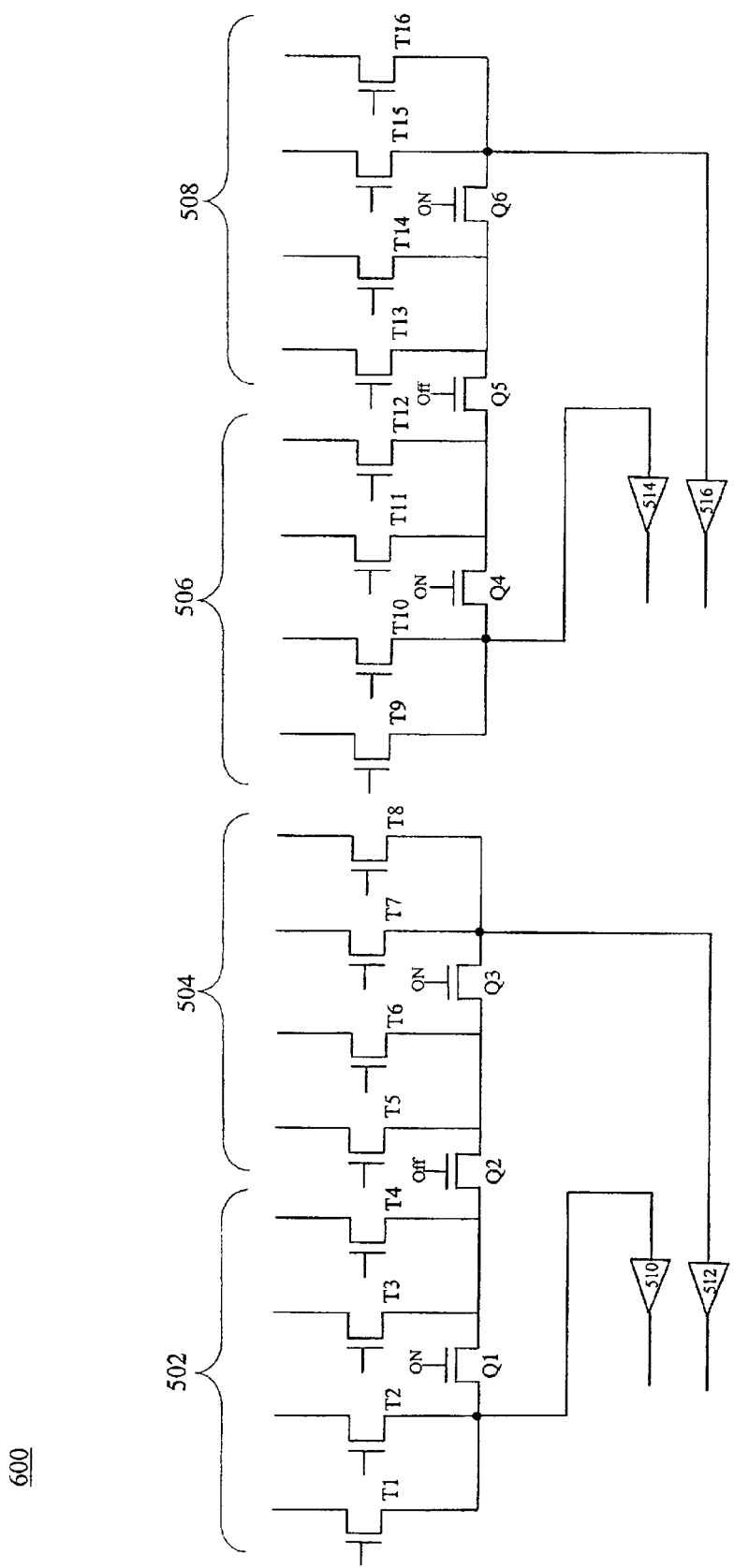
FIG. 6 illustrates a circuit layout of multiplexers and buffers in accordance with an embodiment of the present invention.

FIG. 6 is a circuit diagram 600 illustrating a circuit design of configurable multiplexers in accordance with an embodiment of the present invention. The circuit diagram 600 includes four 4-to-1 configurable multiplexers 502–508 and four buffers 510–516. It is apparent to one of ordinary skilled in the art that other functional blocks may be added to the circuit diagram 600.

A 4-to-1 configurable multiplexer includes four input terminals and one output terminal. In one embodiment, 4to 1 configurable multiplexer is programmed to perform a function of selecting one of the four input signals as its output signal. In another embodiment, 4-to-1 configurable multiplexer is programmed to perform a function of selecting two of the four input signals as its output signals.

Referring to FIG. 6, configurable multiplexers 502, 504, 506, 508 contain n-type transistors T1–T4, T5–T8, T9–T12, and T13–T16, respectively. In one embodiment, each of the configurable multiplexers 502–508 resides in a different multiplexing bank and the multiplexing banks are placed adjacent to each other. The circuit diagram 600 further includes configuration transistors Q1–Q6, which are used to program the multiplexers 502–508. In one embodiment, memory bits, also known as Ram-bits, control the configuration transistors Q1–Q6. In another embodiment, the configuration transistors Q1–Q6 are controlled through a combination of memory bits and control signals. Depending on the logic states of the configuration transistors Q1–Q6, the configurable multiplexers 502–508 perform different functions. It should be apparent to one skilled in the art that the transistors shown in FIG. 6 are not necessary to be all n-type transistors.

When configuration transistors Q1, Q3, Q4, Q6 are logically active and configuration transistors Q2, Q5 are logically inactive, configurable multiplexers 502–508 function as 4-to-1 multiplexers. Different logic states of configuration transistors Q1–Q6 cause the configurable multiplexers 502–508 to function differently. It should be noted that the underlying concept of the present invention would not change if one or more configuration transistors were added to the circuit diagram 600.

Figure 7:
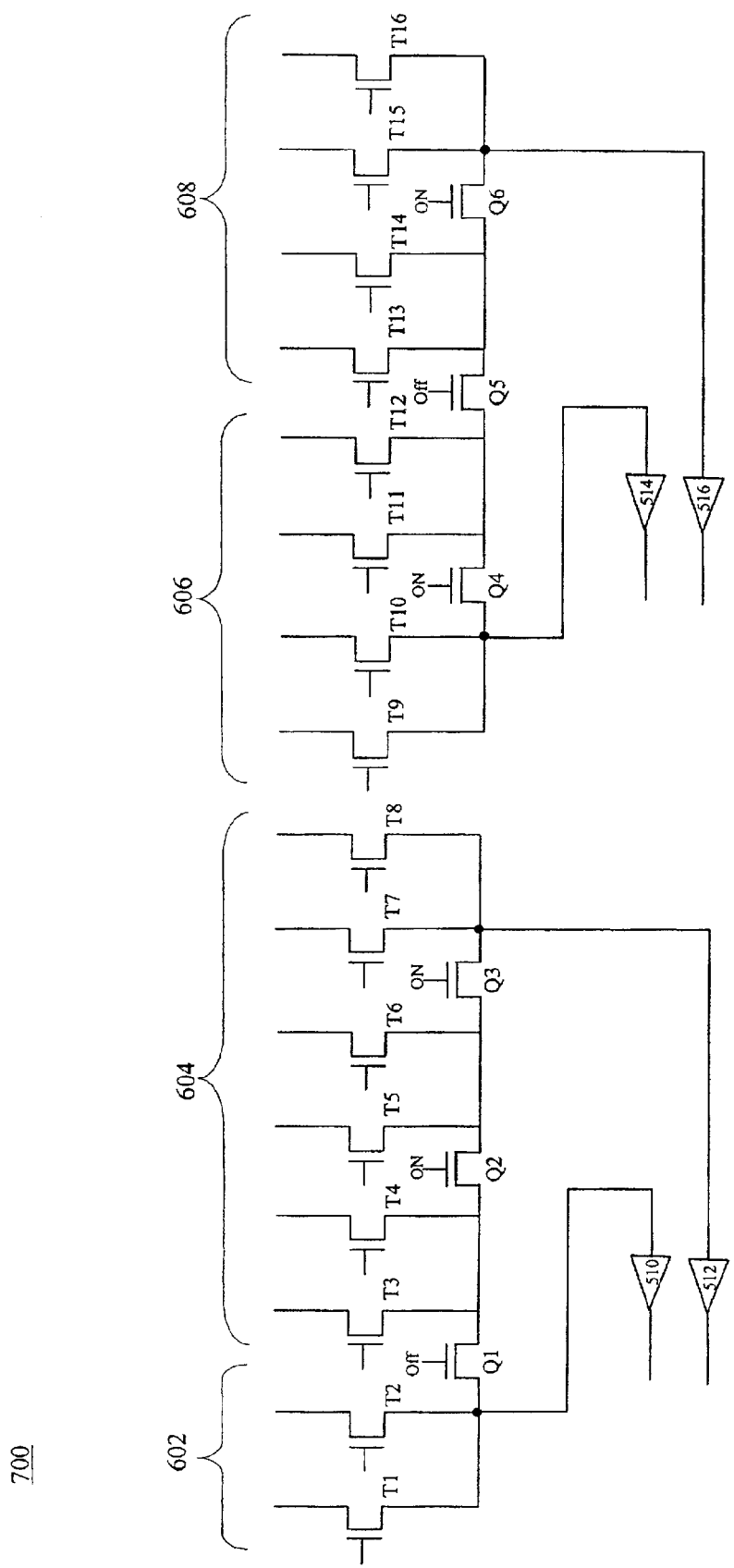
FIG. 7 illustrates another circuit layout of multiplexers and buffers in accordance with an embodiment of the present invention.

FIG. 7 illustrates another circuit layout 700 of configurable multiplexers in accordance with an embodiment of the present invention. The circuit layout 700 includes one 2-to-1 configurable multiplexer 602, one 6-to-1 configurable multiplexer 604, two 4-to-1 configurable multiplexers 606–608, and four buffers 510–516. It is apparent to one of ordinary skilled in the art that other functional blocks may be added to the circuit diagram 700.

Referring to FIG. 7, configurable multiplexers 602, 604, 606, 608 contain n-type transistors TI–T2, T3–T8, T9–T12, and T13–T16, respectively. In this embodiment, transistors T3–T4 of the configurable multiplexer 604 reside in a first bank while transistors T5–T8 reside in a second bank. Moreover, two input terminals of configurable multiplexer 604 are located in the first bank while the other four input terminals of the configurable multiplexer 604 are located in the second bank. As can be seen, an input signal received through the first bank can be routed through the second bank.

When configuration transistors Q2, Q3 are logically active and configuration transistor Q1 is logically inactive, configurable multiplexers 602 functions as 2-to-1 multiplexer while configurable multiplexer 604 functions as 6-to-1 multiplexer. Different logic states of configuration transistors Q1–Q6 cause the configurable multiplexers 602–608 to function differently. It should be noted that the underlying concept of the present invention would not change if one or more configuration transistors were added to the circuit diagram 700.

Figure 8:
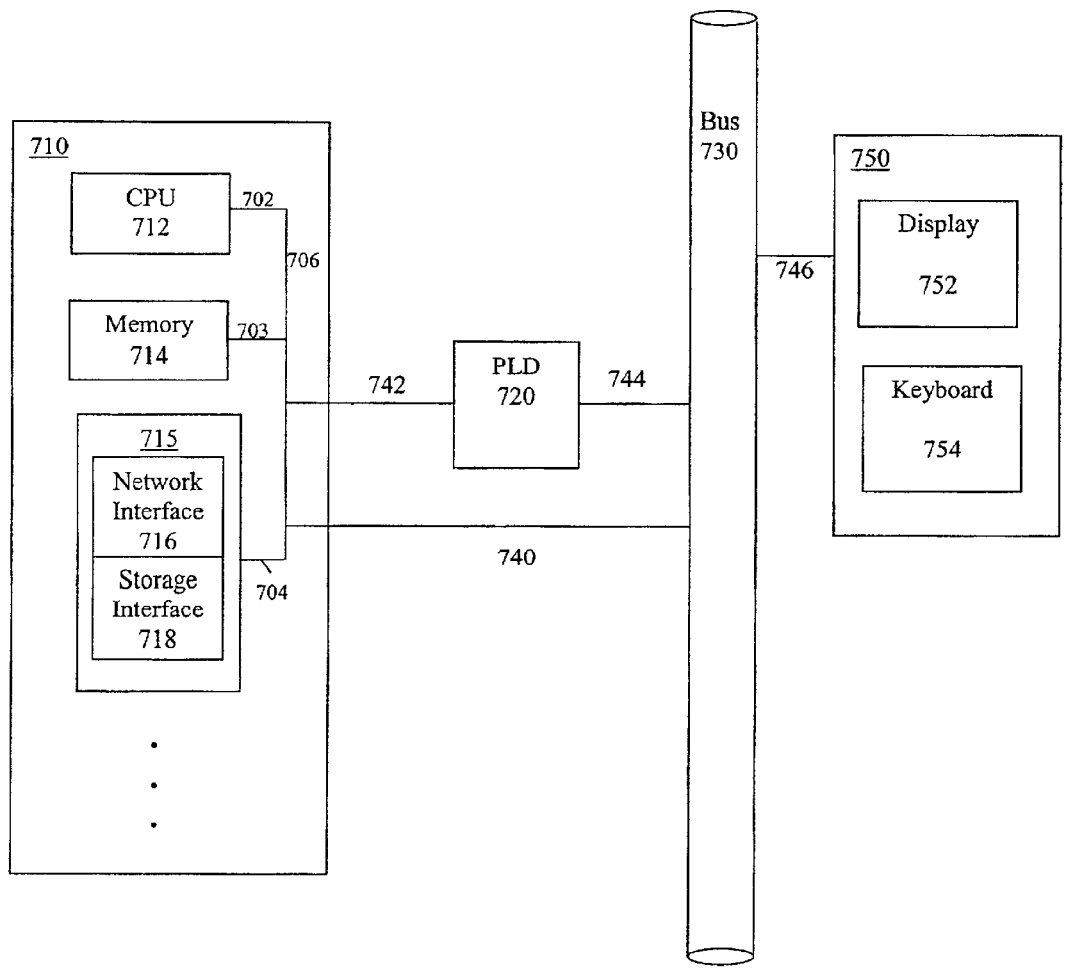
FIG. 8 illustrates a data processing system according to an embodiment of the present invention.

FIG. 8 illustrates a data processing system 701 within which the present invention may be embodied. System 701 includes a bus unit 730, a user-interface unit 750, a PLD 720, and a processing unit 710. System 701 further contains numerous interconnecting channels or wires 740–746 for communicating between the units. Bust unit 730 includes communication means for communicating information, such as data signals, control signals, et cetera. Communication means include co-axis cable, wires, wireless frequencies, and optical fibers.

Processing unit 710 includes a central processing unit ("CPU") 712, a memory 714, and an interface device 715. Numerous local interconnecting channels 702–706 are employed to connect between CPU 712, memory 714, and interface device 715 for transmitting information. CPU 712 includes a microprocessor, such as ARM™, Pentium™, PowerPC™, MIPs™, et cetera for executing instructions.

Memory 714 may include random access memory ("RAM"), flash memory cells, static RAM ("SRAM"), dynamic RAM ("DRAM"), read only memory ("ROM"), magnetic RAM ("MRAM"), et cetera for storing information such as instructions that may be executed by CPU 712. In one embodiment, memory 714 contains multiple independent memories wherein the memories have different memory capacities. For example, memory 714 may contain 1-kilobyte ("1K"), 4-kilobyte ("4K"), and/or 1-Megabyte ("1Meg") memory blocks. System 701 also includes mass storage devices (not shown in FIG. 8) wherein the mass storage may consist of magnetic and/or optical storage mediums for storing large amount of data.

Interface unit 715 includes a network interface device 716 and storage interface device 718 for transmitting information between various sources. Network interface device 716, in one embodiment, provides communication between system 700 and various networks. The means of network includes, but not limited to, optical, cable, and/or wireless networks. Storage interface 718 facilitates communication between system 700 and mass storage devices. It should be apparent to one skilled in the art that the interface device 710 may contain other devices such as clock trees, floating-point unit, et cetera. It should be further noted that interface unit 715 could be implemented in a PLD with or without some embedded digital signal processing circuits.

PLD 720 is a configurable logic device, which is also referred to as a PAL, PLA, FPLA, PLD, CPLD, EPLD, EEPLD, or FPGA, that provides the advantages of fixed integrated circuits with the flexibility of custom integrated circuits. In one embodiment, PLD 720 contains a multiplexing structure (not shown in FIG. 8) that may configurable multiplexers. PLD 720 can be configured to provide various combinatorial logic functions including, but not limited to, address decoder and encoder, data storage, network switching, information processing, digital processing, et cetera For example, PLD 720 may be configured to perform address decoder between bus unit 730 and processing unit 710.

In the foregoing specification the invention has been described with reference to specific exemplary embodiments thereof. It will, however, be evident that various modifications and changes may be made thereto without departing from the broader scope of the invention. The specification and drawings are, accordingly, to be regarded in an illustrative rather than restrictive sense.

What is claimed is:

1. An integrated circuit ("IC") device comprising:
   a first routing array ("RA"), the first RA having a configurable multiplexer, the configurable multiplexer having at least two outputs, and one output circuit, wherein one output of the configurable multiplexer of the first RA is coupled with the output circuit of the first RA;
   a second RA, having at least one configurable multiplexer and one output circuit, coupled to the first RA, wherein at least one output of the configurable multiplexer of the first RA is programmed to couple to the output circuit of the second RA; and
   a logic block, having a configurable element, coupled to the first and second RAs, wherein the configurable multiplexer of the first RA routes a signal to the logic block via the output circuit of the second RA.

2. The IC device of claim 1 further comprises:
   a first set of routing wires coupled to the first RA, the first set of routing wires configured to receive a first group of input data and to transmit the first group of input data to the first RA; and
   a second set of routing wires coupled to the second RA, the second set of routing wires configured to receive a second group of input data and to transmit the second group of input data to the second RA.

3. The IC device of claim 2, wherein the logic block is a programmable logic circuit capable of performing various product-term logical functions.

4. The IC device of claim 3, wherein the configurable multiplexer of the first RA routes another signal to the logic block via the output circuit of the first RA.

5. The IC device of claim 4, wherein the input data includes signals from input/output pins, input pins, and feedback paths.

6. The IC device of claim 5, wherein the signal to the logic block via the output circuit of the second RA is from the first group of input data.

7. The IC device of claim 6, wherein the signal to the logic block via the output circuit of the first RA is from the first group of input data.

8. The IC device of claim 1, wherein the first RA includes nine configurable multiplexers and wherein the second RA includes nine configurable multiplexers.

9. The IC device of claim 1, wherein the output circuit of the first RA is part of the configurable multiplexer of the first RA and the output circuit of the second RA is a part of the configurable multiplexer of the second RA.

10. The IC device of claim 9, wherein the configurable multiplexer is programmable to function as one of a 4-to-1 multiplexer and 4-to-2 multiplexer.

11. A device comprising:
    a first set of routing channels configured to transmit a first input data;
    a first configurable interconnect array, having a plurality of first routing blocks, coupled to the first set of routing channels, wherein each of the first routing blocks includes a first selecting circuit and a first output circuit;
    a second set of routing channels configured to transmit second input data;
    a second configurable interconnect array, having a plurality of second routing blocks, coupled to the second set of routing channels, wherein each of the plurality of second routing blocks includes a second selecting circuit and a second output circuit; and
    a logic block, having a configurable element, coupled to the first and second configurable interconnect arrays, wherein one of the first selecting circuit of the plurality of the first routing blocks transmits a first signal of the first input data to the logic block via one of the second output circuit of the plurality of second routing blocks.

12. The device of claim 11, wherein the first selecting circuit further transmits a second signal of the first input data to the logic block via the first output circuit.

13. The device of claim 12, wherein the first selecting circuit is programmed to coupled to the second output circuit.

14. The device of claim 12, wherein the first selecting circuit is programmed to coupled to the first output circuit.

15. The device of claim 11, wherein the first selecting circuit is configurable to a 4-to-1 multiplexer or a 4-to-2 multiplexer.

16. A digital processing system comprising:
   a processor;
   a memory coupled to the processor; and
   a circuit as defined in claim 11 coupled to the processor and memory.

17. A printed circuit board on which is mounted an integrated circuit as defined in claim 11.

18. The printed circuit board of claim 17, further comprising:
   a memory mounted on the printed circuit board and coupled to the integrated circuit; and
   a processor mounted on the printed circuit board and coupled to the memory.

19. A method of routing signals in an integrated circuit, comprising:
   programming a first configurable multiplexer having at least two outputs to connect a first output of the first configurable multiplexer in a first routing array ("RA") to an input of a output circuit in a second RA;
   receiving a first set of signals from a first set of routing wires;
   selecting a first signal from the first set of signals; and
   transmitting the first signal to a logic block via the second output circuit.

20. The method of claim 19 further comprising:
   selecting a second signal from the first set of signals in response to first control signals; and
   transmitting the second signal to said logic block via a first output circuit in the first RA.

21. The method of claim 20, wherein the programming to connect a first output of a first configurable multiplexer in a first RA to an input of a second output circuit in a second RA further includes:
   programming the first configurable multiplexer; and
   programming the second output circuit.

22. The method of claim 21, wherein the programming the first configurable multiplexer includes configuring the first configurable multiplexer to function as two 2- to-1 multiplexers.

23. The method of claim 21, wherein the programming the second output circuit includes:
   programming to logically disconnect the second output circuit from a second configurable multiplexer in the second RA; and
   programming to logically connect the second output circuit to the first configurable multiplexer.

24. An apparatus for routing signals in an integrated circuit, comprising:
   means for selecting a first circuit to transmit a first input signal to a programmable logic block;
   means for selecting a second circuit to transmit the first input signal to the programmable logic block when the first circuit is busy; and
   means for selecting a third circuit to transmit the first input signal to the programmable logic block when the first and second circuits are busy.

25. The apparatus of claim 24 further comprising:
   means for selecting the second circuit to transmit a second input signal to the programmable logic block;
   means for selecting the first circuit to transmit the second input signal to the programmable logic block when the second circuit is busy; and
   means for selecting a fourth circuit to transmit the second input signal to the programmable logic block when the first and second circuits are busy.

26. The apparatus of claim 24, wherein the means for selecting a first circuit to transmit a first input signal to a programmable logic block further includes:
   means for generating a first output signal in response to the first input signal;
   means for buffering the first output signal; and
   means for transmitting the first output signal to the programmable logic block via a bus.

27. The apparatus for claim 24, wherein the means for transmitting the first output signal to the programmable logic block via a bus further includes:
   means for identifying a plurality conductors within the bus;
   means for selecting a first conductor that connects to the programmable logic block; and
   means for transmitting the first output signal to the programmable logic block over the first conductor.

28. The apparatus of claim 24, wherein the means for selecting a second circuit to transmit the first input signal to the programmable logic block when the first circuit is busy further includes:
   means for identifying whether the first circuit is assigned to select the first input signal as its output signal; and
   means for indicating the first circuit is busy when the first circuit does not select the first input signal as its output signal.

29. A device comprising:
   a first configurable multiplexer; and
   a control circuit coupled to the first configurable multiplexer, the control circuit selectively programming the first configurable multiplexer to be one of 6-to-1, 4-to-1, and 2-to-1 multiplexers.

30. The device of claim 29 further comprising:
   a first output circuit coupled to the first configurable multiplexer;
   a second output circuit coupled to a second configurable multiplexer; and
   a logic block, having a configurable element, coupled to the first and second configurable multiplexers, wherein the first configurable multiplexer routes a signal to the logic block via second output circuit.

31. The device of claim 29, wherein the control circuit selectively program the first configurable multiplexer to be a 4-to-1 multiplexer.

32. The device of claim 29, wherein the control circuit selectively programs the first configurable multiplexer to be two 2-to-1 multiplexers.

* * * * *